US010268110B2

(12) United States Patent
Rebiffe et al.

(10) Patent No.: US 10,268,110 B2
(45) Date of Patent: Apr. 23, 2019

(54) DIODE LIGHT SOURCE FOR A PROJECTOR

(71) Applicant: XYZED, Paris (FR)

(72) Inventors: Maurice Rebiffe, Paris (FR); Jean Pierre Ferrandon, Chilly Mazarin (FR)

(73) Assignee: XYZED, Paris (FR)

( * ) Notice: Subject to any disclaimer, the term of this patent is extended or adjusted under 35 U.S.C. 154(b) by 0 days.

(21) Appl. No.: 15/542,983

(22) PCT Filed: Jan. 11, 2016

(86) PCT No.: PCT/FR2016/050040
§ 371 (c)(1),
(2) Date: Jul. 12, 2017

(87) PCT Pub. No.: WO2016/113490
PCT Pub. Date: Jul. 21, 2016

(65) Prior Publication Data
US 2018/0024427 A1    Jan. 25, 2018

(30) Foreign Application Priority Data

Jan. 12, 2015   (FR) ...................................... 15 50208

(51) Int. Cl.
*G03B 21/20* (2006.01)
*G02B 5/10* (2006.01)
(Continued)

(52) U.S. Cl.
CPC .......... *G03B 21/2033* (2013.01); *G02B 5/10* (2013.01); *G02B 6/0006* (2013.01); *G02B 6/26* (2013.01);
(Continued)

(58) Field of Classification Search
None
See application file for complete search history.

(56) References Cited

U.S. PATENT DOCUMENTS

| 4,297,000 A | 10/1981 | Fries |
| 5,204,922 A * | 4/1993 | Weir .................. A61B 5/14539 356/419 |

(Continued)

FOREIGN PATENT DOCUMENTS

| EP | 0717476 A1 | 6/1996 |
| JP | 2007047245 A | 2/2007 |

OTHER PUBLICATIONS

"Cinemeccanica France—Cinecloud(TM) Lux the Smart Cinema Laser," Dec. 2, 2014, URL: https://web.archive.org/web/20141202191832/http://www.cinemeccanica.fr/cin%C3%A9ma/cinecloud-lux-the-smart-cinema-laser.
French Search Report for corresponding French Application No. FR1550208, dated Dec. 3, 2015.
International Search Report for corresponding International PCT Application No. PCT/FR2016/050040, dated May 6, 2016.

*Primary Examiner* — Christle I Marshall
(74) *Attorney, Agent, or Firm* — Workman Nydegger

(57) ABSTRACT

A projector includes a diode light source for a projector. The light source comprises at least first, second, and third diode matrices respectively delivering at least first, second, and third light bundles at separate wavelengths and of determined dimensions. A first dichroic plate forms a first combined light bundle CLC1 from the first and second light bundles, a second dichroic plate forming a second combined light bundle CLC2 from the first combined light bundle and the third light bundle, and an off-axis parabolic mirror for receiving the second combined light bundle CLC2 and focusing it on a determined focal point forming an inlet point for a single optical fiber.

9 Claims, 2 Drawing Sheets

(51) Int. Cl.
  *G03B 21/16* (2006.01)
  *G02B 6/26* (2006.01)
  *G03B 33/12* (2006.01)
  *H01L 25/075* (2006.01)
  *H04N 9/31* (2006.01)
  *G02B 27/10* (2006.01)
  *F21V 8/00* (2006.01)
  *G02B 27/14* (2006.01)

(52) U.S. Cl.
  CPC ....... *G02B 27/1006* (2013.01); *G02B 27/141* (2013.01); *G03B 21/16* (2013.01); *G03B 21/2013* (2013.01); *G03B 21/2066* (2013.01); *G03B 33/12* (2013.01); *H01L 25/0753* (2013.01); *H04N 9/3144* (2013.01); *H04N 9/3164* (2013.01); *H04N 9/3167* (2013.01); *H04N 9/3182* (2013.01); *H01L 2924/0002* (2013.01)

(56) References Cited

U.S. PATENT DOCUMENTS

| | | | |
|---|---|---|---|
| 5,408,552 A * | 4/1995 | Davenport | G02B 6/264 385/18 |
| 6,224,216 B1 | 5/2001 | Parker et al. | |
| 6,252,719 B1 * | 6/2001 | Eichenbaum | G02B 27/145 359/634 |
| 6,406,193 B1 * | 6/2002 | Raj | G02B 6/262 385/31 |
| 8,199,405 B2 * | 6/2012 | Geidek | F41H 13/0062 359/626 |
| 9,606,306 B2 * | 3/2017 | Chang | G02B 6/4215 |
| 2006/0164600 A1 | 7/2006 | Morejon et al. | |
| 2011/0178409 A1 * | 7/2011 | Harris | A61B 5/0066 600/476 |
| 2013/0271761 A1 * | 10/2013 | Rutberg | G01J 3/0208 356/318 |

* cited by examiner

DIODE LIGHT SOURCE FOR A PROJECTOR

FIELD OF THE INVENTION

The present invention relates to the field of lighting and it relates more particularly to a source of white light for cinema or video projectors using light-emitting diodes (LEDs) or laser diodes.

PRIOR ART

Until recently, projectors were conventionally constituted by an incandescent lamp or by a discharge lamp of the xenon, HMI, or HTI type, with a reflector for focusing the light beam coming from the lamp towards an optical system having one or more lenses arranged in the light beam. In spotlights for the stage or spectacles, various shutters are also placed in the outlet from the optical system in order to provide special effects, e.g. an overlay knife, a color wheel, an iris, and a gobo wheel.

Nevertheless, over the last few years, projectors have appeared on the lighting market, in particular for cinema and video, in which the light sources that are to replace such discharge or incandescent lamps are constituted by LEDs or laser diodes, as in U.S. Pat. No. 6,224,216. Unfortunately, those projectors are penalized by the large size of those light sources, due essentially to the very large number of optical fibers used for collecting the light. That large number of optical fibers is specifically the result of the difficulty of collimating beams from diodes on a single focal point in order to enable the light to be concentrated in a single outlet optical fiber having a running diameter of the order of 400 micrometers (μm) to 1500 μm, and the standard numerical aperture of about 0.22, up to preferably 0.37. Furthermore, diodes connected in series are managed in small numbers, often in series of six to 12 diodes at most, and those series of diodes are generally grouped together by color (red, green, blue), each of these colors being connected to a different optical fiber. Thus, each RGB module connected to a control card needs to be connected to a fiber, which does not make it easy to multiply the number of modules in order to obtain high lighting power (typically greater than 30 watts (W)) in a volume that is small, easy to access, and above all suitable for easy assembly both in fabrication and for maintenance.

OBJECT AND SUMMARY OF THE INVENTION

The present invention seeks to overcome that constraint with a lighting projector in which the source of light can be simplified considerably. An object of the invention is to obtain a light source that is particularly compact but that nevertheless enables high lighting power to be delivered, greater than 30 W and possibly up to more than 100 W.

These objects are achieved by a diode light source for a projector, the light source comprising at least first, second, and third diode matrices respectively delivering at least first, second, and third light bundles CL1, CL2, CL3 at separate wavelengths and of determined dimensions, and being characterized in that it further comprises:

a first dichroic plate suitable for forming a first combined light bundle CLC1 from said first and second light bundles;

a second dichroic plate suitable for forming a second combined light bundle CLC2 from said first combined light bundle and said third light bundle; and an off-axis parabolic mirror for receiving said second combined light bundle CLC2 and focusing it on a determined focal point suitable for forming an inlet point for a single optical fiber.

Thus, by eliminating all of the optical fibers for collimating each color and by using a set of dichroic plates to reflect the various light beams coming from the RGB diodes onto a single off-axis parabolic mirror, it becomes possible to concentrate all of the light beams on a single determined focal point at the inlet to a single optical fiber serving to convey the light and in which the three primary colors are mixed together.

In one intended embodiment, said first dichroic plate is configured to allow said first light bundle CL1 at a first wavelength delivered by said first diode matrix to pass therethrough and to reflect said second light bundle CL2 of a second wavelength delivered by said second diode matrix in order to form said first combined light bundle CLC1, and said second dichroic plate is configured to allow said third light bundle CL3 at a third wavelength delivered by said third diode matrix to pass therethrough and to reflect said first combined light bundle CLC1 to form said second combined light bundle CLC2.

Advantageously, said second dichroic plate is arranged perpendicularly to said first dichroic plate, each of said dichroic plates also being arranged at 45° relative to said light bundles.

Preferably, the diode light source further includes a polarizing filter allowing said second light bundle CL2 at said second wavelength to pass therethrough and reflecting a fourth light bundle at said second wavelength delivered by a fourth diode matrix to form a combined light bundle going to said first dichroic plate.

In an alternative embodiment, said first dichroic plate is configured to allow said second light bundle CL2 at a second wavelength delivered by said second diode matrix to pass therethrough and to reflect said first light bundle CL1 at a first wavelength delivered by said first diode matrix in order to form said first combined light bundle CLC1, and said second dichroic plate is configured to allow said first combined light bundle CLC1 to pass therethrough and to reflect said third light bundle CL3 at a third wavelength delivered by said third diode matrix to form said second combined light bundle CLC2.

Advantageously, the second dichroic plate is arranged parallel to said first dichroic plate, with each of said dichroic plates also being arranged at 45° relative to said light bundles.

Preferably, said diodes are light-emitting diodes or laser diodes.

Advantageously, said first, second, and third wavelengths correspond respectively to the blue, red, and green primary colors.

The invention also provides a lighting projector including at least one diode white light source as described above.

BRIEF DESCRIPTION OF THE DRAWINGS

The characteristics and advantages of the present invention appear better from the following description given by way of non-limiting indication and with reference to the accompanying drawings, in which.

DETAILED DESCRIPTION OF A PREFERRED EMBODIMENT

Figure 1:
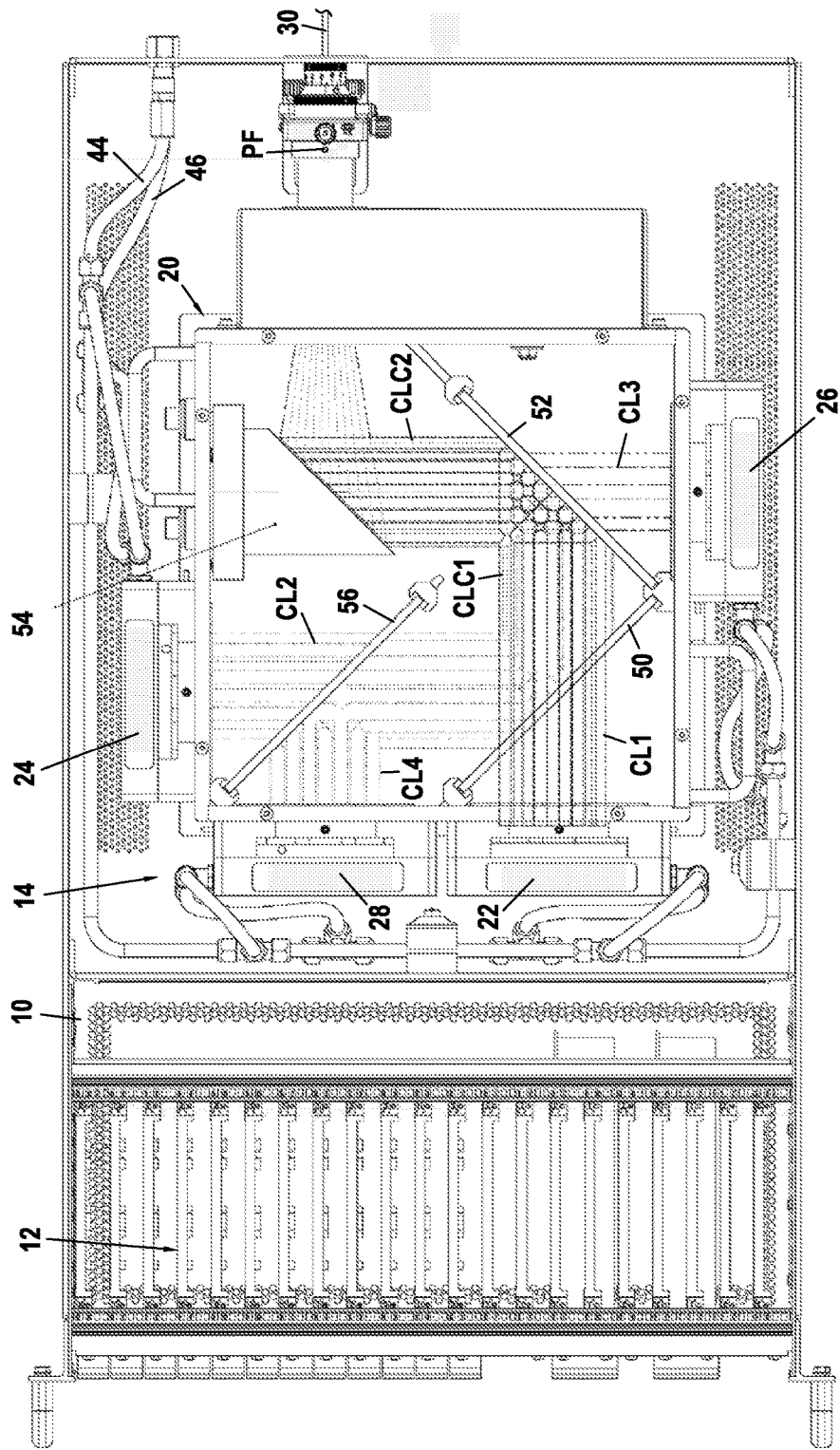
FIG. 1 is a fragmentary plan view of a projector of the invention.

FIG. 1 shows a diode light source in accordance with the invention for mounting in a standard power supply chassis of the 2U, 3U, or 4U rack type (i.e. suitable for being mounted directly in a standard 19 inch rack). The chassis 10 has an electronic portion 12 that is to receive various cards for controlling diodes and an optical portion 14 designed to receive the light source proper and including means for dissipating the heat given off by the diodes.

In the invention, the light source 20 is a high power light source that is very compact, being made up from three laser diode lighting modules 22, 24, and 26 arranged at 90° to one another, and from an optical system serving to collimate and focus the light beams coming from these modules into a single outlet optical fiber. Nevertheless, for better color balance, the light source is preferably, but not necessarily, made up from four laser diode modules, the fourth module 28 then advantageously being arranged on the axis of the outlet optical fiber 30.

Figure 2:
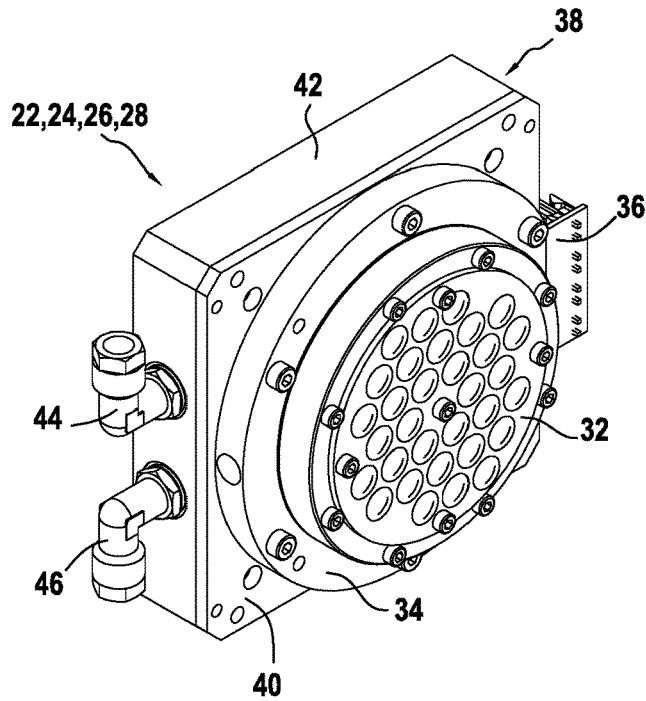
FIG. 2 is a perspective view of a diode lighting module of the FIG. 1 projector.

As shown in FIG. 2, each laser diode module has a large number of laser diodes 32 of the same wavelength, that are regularly distributed in the form of a matrix (32 diodes in this figure corresponding to green diodes, and typically 12 to 60 diodes of power that varies depending on the type and the technology used), and they are mounted on a support plate 34, with each diode being covered by a lens of very small size made of plastics material or of glass that is carried by a centering element (neither of which is shown), so as to produce a corresponding number of parallel light beams, these beams together forming a kind of light bundle CL of the color associated with the wavelength of the diodes in the matrix. It should be observed that these diodes could also be RGB diodes in which only of the colors is activated, with the anode corresponding to the selected color then being the only anode that is connected.

The support plate 34 includes conductor tracks (not shown) that are connected to electrical power supply terminals 36 and it is directly in contact with means 38 for dissipating the heat given off by the diode matrix. These heat dissipation means are described in greater detail in the application filed on the same day and entitled "A diode lighting module with improved cooling" and they comprise a metal junction plate 40 having an outside face in direct contact with the support plate and an inside face supporting a cellular metal foam contained in a box 42 in the form of a partitioned vessel that is leaktight with respect to a cooling fluid, advantageously water in the liquid phase or glycol water, with the metal junction plate 40 constituting its lid. The cooling fluid is conveyed respectively to and from the diode modules by go-and-return pipes 44 and 46.

Returning to FIG. 1, the diode light source that is shown has four laser diode modules suitable for forming four separate light bundles on the basis of parallel light beams from each of the diodes in the four modules. Each module delivers a color determined by the wavelength of the identical diodes that make it up, and the dimensions of the light bundles are determined by the size of the matrix and thus by the number of diodes. More particularly, in order to create white light, a first dichroic plate 50 arranged at 45° allows a first light bundle CL1 of light at a first wavelength (typically 430 nanometers (nm) to 460 nm) corresponding to the blue primary color, and coming from the first laser diode module 22, to pass therethrough while reflecting a second light bundle CL2 at a second wavelength (typically 620 nm to 650 nm) corresponding to the red primary color coming from the second laser diode module 24, so as to form a first combined light bundle CLC1 transporting the blue and red colors. A lowpass filter structure having a cutoff frequency of about 470 nm is entirely suitable for such a first dichroic plate. Likewise, a second dichroic plate 52 also arranged at 45° but perpendicularly, allows a third light bundle CL3 at a third wavelength (typically 510 nm to 530 nm) corresponding to the green primary color and coming from the third laser diode module 26 to pass therethrough, while reflecting the first combined light bundle so as to form a second combined light bundle CLC2 then transporting the three primary colors to an off-axis parabolic mirror 54 arranged across this combined light bundle so as to reflect and focus it on a predetermined focal point PF at the inlet to the sole outlet optical fiber 30. A bandpass filter structure having low and high cutoff frequencies of about 500 nm and 540 nm is entirely suitable for such a second dichroic plate.

In a preferred embodiment, the diode light source has four laser diode modules, and it is thus provided with a third separator constituted by a polarizing filter 56 arranged across the second light bundle CL2 (i.e. at an angle of 45° with the central axis of the bundle), which bundle transports the red primary light so as to allow that light to pass through the filter while also reflecting a fourth light bundle CL4 at the second wavelength, this also corresponding to the red primary color in order to form a combined light bundle that nevertheless includes only this red primary color going to the first dichroic plate 50. Adding a second red light module makes it possible, by better color balancing, to obtain white light by additive synthesis of the red, green, and blue colors. Specifically, red diodes are nowadays of lower power than green and blue diodes, such that combining an equivalent number of diodes of each color does not enable good quality white light to be obtained (in particular capable of satisfying the digital cinema initiatives (DCI) standards), which is why it is necessary to have recourse to an additional red diode module in order to obtain a better balance.

Figure 3:
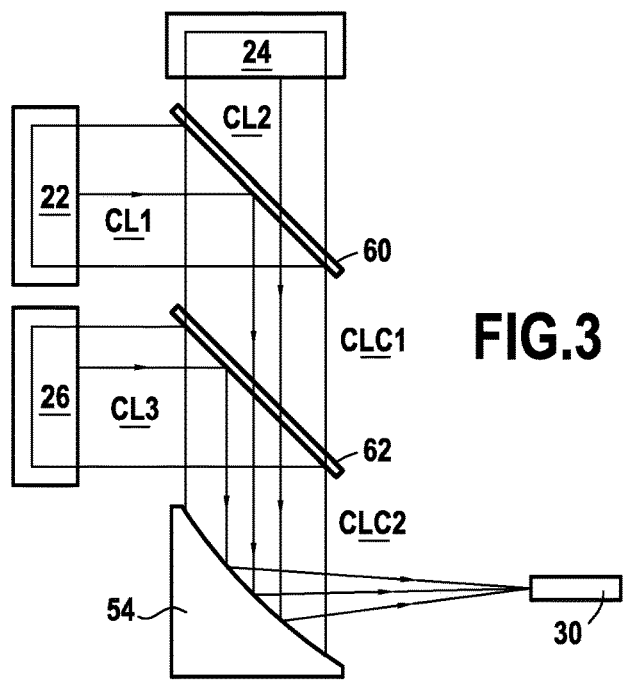
FIG. 3 is a diagram showing the paths of the light beams in another example of a projector of the invention.

Naturally, it is clear that depending on the type of the diodes involved, the additional module could be of a color other than red, and indeed it need not be present (see FIG. 3).

It should be observed that by arranging the three first laser diode modules at 90° to one another, it is possible to obtain a square configuration for the optical system that is particularly compact and thus suitable for installing without difficulty in standardized 2U to 4U type chassis, the first and second dichroic plates 50 and 52 themselves being at 90° to each other and the polarizing filter 56 being parallel to the first plate, each occupying one quadrant of the square, with the parabolic mirror 54 occupying the last quadrant.

The simplified diagram of FIG. 3 shows another embodiment of the light source of the invention in which the first dichroic plate presents a highpass filter structure with a cutoff frequency of about 470 nm and the second dichroic plate presents a band-stop filter structure with low and high cutoff frequencies of about 500 nm and 540 nm. In this more compact configuration (in a chassis not greater than 4U, it is possible to install four sources of this type instead of two of the above type, with the electronics remaining unchanged), the first dichroic plate 60 arranged at 45° passes the second light bundle CL2 corresponding to the red primary color coming from the second laser diode module 24 and reflects the first light bundle CL1 corresponding to the blue primary color coming from the first laser diode module 22 in order to form the first combined light bundle CLC1 transporting the blue and red colors. Likewise, the second dichroic plate 62 arranged parallel to the first and thus likewise at 45° passes the first combined light bundle and reflects the third light bundle CL3 corresponding to the green primary color coming from the third laser diode module 26 in order to form the second combined light bundle CLC2 which then transports the three primary colors to the off-axis parabolic mirror 54 arranged across this second combined light bundle so as to reflect and focus it onto a determined inlet focal point to the sole outlet optical fiber 30.

The invention claimed is:

1. A diode light source for a projector, the diode light source comprising at least first, second, and third diode matrices respectively delivering at least a first light bundle, a second light bundle, and a third light bundle at separate wavelengths and of determined dimensions, and wherein the diode light source further comprises:
a first dichroic plate suitable for forming a first combined light bundle from said first and second light bundles;
a second dichroic plate suitable for forming a second combined light bundle from said first combined light bundle and said third light bundle;
an off-axis parabolic mirror for receiving said second combined light bundle and focusing it on a determined focal point suitable for forming an inlet point for a single optical fiber; and
a polarizing filter configured to allow said second light bundle at said second wavelength to pass therethrough and to reflect a fourth light bundle at said second wavelength delivered by a fourth diode matrix to form a combined light bundle going to said first dichroic plate.

2. The diode light source according to claim 1, wherein:
said first dichroic plate is configured to allow said first light bundle at a first wavelength delivered by said first diode matrix to pass therethrough and to reflect said second light bundle of a second wavelength delivered by said second diode matrix in order to form said first combined light bundle; and
said second dichroic plate is configured to allow said third light bundle at a third wavelength delivered by said third diode matrix to pass therethrough and to reflect said first combined light bundle to form said second combined light bundle.

3. The diode light source according to claim 2, wherein said second dichroic plate is arranged perpendicularly to said first dichroic plate, each of said first and second dichroic plates being arranged at 45° relative to said first and second combined light bundles.

4. The diode light source according to claim 1, wherein:
said first dichroic plate is configured to allow said second light bundle at a second wavelength delivered by said second diode matrix to pass therethrough and to reflect said first light bundle at a first wavelength delivered by said first diode matrix in order to form said first combined light bundle; and
said second dichroic plate is configured to allow said first combined light bundle to pass therethrough and to reflect said third light bundle at a third wavelength delivered by said third diode matrix to form said second combined light bundle.

5. The diode light source according to claim 4, wherein the second dichroic plate is arranged parallel to said first dichroic plate, with each of said dichroic plates also being arranged at 45° relative to said first and second combined light bundles.

6. The diode light source according to claim 2, wherein said diodes are light-emitting diodes or laser diodes.

7. The diode light source according to claim 2, wherein said first, second, and third wavelengths correspond respectively to the blue, red, and green primary colors.

8. A lighting projector including at least one diode white light source according to claim 7.

9. A diode light source for a projector, the diode light source comprising at least first, second, and third diode matrices respectively delivering at least a first light bundle, a second light bundle, and a third light bundle at separate wavelengths and of determined dimensions, and wherein the diode light source further comprises:
a first dichroic plate suitable for forming a first combined light bundle from said first and second light bundles;
a second dichroic plate suitable for forming a second combined light bundle from said first combined light bundle and said third light bundle and arranged at an angle relative to the first dichroic plate, the first and second dichroic plates being arranged at an angle relative to the first and second combined light bundles;
an off-axis parabolic mirror for receiving said second combined light bundle and focusing it on a determined focal point suitable for forming an inlet point for a single optical fiber;
said first dichroic plate is configured to allow said first light bundle at a first wavelength delivered by said first diode matrix to pass therethrough and to reflect said second light bundle of a second wavelength delivered by said second diode matrix in order to form said first combined light bundle;
said second dichroic plate is configured to allow said third light bundle at a third wavelength delivered by said third diode matrix to pass therethrough and to reflect said first combined light bundle to form said second combined light bundle;
a polarizing filter arranged across the second light bundle at an angle relative to the central axis of second light bundle at said second wavelength to pass therethrough and to reflect the fourth light bundle at said second wavelength delivered by the fourth diode matrix to form a combined light bundle going to said first dichroic plate.

* * * * *